(12) United States Patent
Komori

(10) Patent No.: US 6,492,674 B1
(45) Date of Patent: Dec. 10, 2002

(54) SEMICONDUCTOR DEVICE HAVING AN IMPROVED PLUG STRUCTURE AND METHOD OF MANUFACTURING THE SAME

(75) Inventor: Shigeki Komori, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/584,690

(22) Filed: Jun. 1, 2000

(30) Foreign Application Priority Data

Dec. 16, 1999 (JP) .......................................... 11-357876

(51) Int. Cl.[7] ............................................ H01L 31/119
(52) U.S. Cl. ...................... 257/306; 257/298; 257/329; 257/401; 257/305; 257/303; 257/369; 257/279
(58) Field of Search ................................ 257/298, 306, 257/329, 401, 305, 303, 369, 288, 351, 365, 368, 382, 524, 758, 774, 775, 383–385; 438/218–221, 294–297, 586, 637, 638

(56) References Cited

U.S. PATENT DOCUMENTS

| 5,624,863 A | * | 4/1997 | Helm et al. | ................. 438/210 |
| 5,807,779 A | * | 9/1998 | Liaw | ........................... 438/279 |
| 5,970,335 A | * | 10/1999 | Helm et al. | ................. 438/232 |
| 6,069,038 A | * | 5/2000 | Hashimoto et al. | ......... 438/241 |
| 6,118,158 A | * | 9/2000 | Kim | ........................... 257/369 |
| 6,300,229 B1 | * | 10/2001 | Tanaka et al. | .............. 257/369 |

FOREIGN PATENT DOCUMENTS

| JP | 10-50950 | 2/1998 |
| JP | 11-186386 | 7/1999 |

* cited by examiner

Primary Examiner—Matthew Smith
Assistant Examiner—V. Yevsikov
(74) Attorney, Agent, or Firm—McDermott, Will & Emery

(57) ABSTRACT

A conductive plug is formed in an interlayer insulation film and on an isolating layer which isolates semiconductor elements on a semiconductor substrate. The conductive plug electrically connects a pair of active regions of the semiconductor elements formed on the different sides of the isolating layer. Alternatively, a conductive plug is formed in an interlayer insulation film and on a conducive line formed on an isolating layer which isolates semiconductor elements on a semiconductor substrate. The conductive plug electrically connects the conductive line and an active region of the semiconductor element.

17 Claims, 10 Drawing Sheets

SEMICONDUCTOR DEVICE HAVING AN IMPROVED PLUG STRUCTURE AND METHOD OF MANUFACTURING THE SAME

BACKGROUND OF THE INVENTION

1. Field of the Invention

The present invention relates to a method of manufacturing a semiconductor device in which a conductive plug embedded in a contact hole (corresponding to an interconnection hole) and an interconnect utilizing a trench are formed simultaneously, as well as to a semiconductor device manufactured by the method.

2. Background Art

With tendency toward a rapid reduction in size of a semiconductor element, minute contacts and interconnections are ever demanded. In a conventional semiconductor device with low integration level, contact holes or interconnection holes are formed in a dielectric film to establish electrical contact between active regions. Further, a wafer is etched after deposition of material for interconnections.

In recent years, a mixed-manufacturing process has become dominant for manufacturing a memory device, typified by dynamic random access memory (DRAM), and a logic device on a single wafer. In such a DRAM, a thickness of an interlayer insulating film is increased to fabricate an internal capacitor, so that a deep contact hole or an interconnection hole must be formed. Thus, difficulty is imposed in the process of forming contacts and interconnections.

FIG. 20 is a cross-sectional view for explaining a principal structure of a conventional semiconductor device. In a conventional semiconductor device 100C in which a DRAM and a logic device are formed in a same device, a thick interlayer oxide film is needed for manufacturing a capacitor. However, contact holes or interconnection holes could not be formed in the thick interlayer oxide film in a single process. For instance, as shown in FIG. 20, a first conductive plug 40 is connected to a second conductive plug 6, and the plug 6 is connected to a gate electrode 5 of a MOSFET which is isolated by an isolation oxide film 2 provided in a semiconductor substrate or a silicon substrate 1. Thus, a two-layer configuration of the plug 6 and the plug 40 is needed in the manufacturing process.

A lower interconnecting layer 50 provided between the first conductive plug 40 and the second conductive plugs 6 establishes local electrical connection. When the same material is used for the second conductive plugs 6 and the lower interconnecting layer 50, a certain minimum distance must be ensured between adjacent lower interconnecting layers 50, resulting in deterioration of the packing density of the integrated circuit. In order to avoid such deterioration in packing density, the lower interconnecting layer 50 must be formed from material differing from that of the second conductive plugs 6.

An upper interconnecting layer 51 establishes local electrical connection, as does the lower interconnecting layer 50. When the same material is used for the first conductive plug 40 and the upper interconnecting layer 51, a certain minimum distance must be ensured between the adjacent upper interconnecting layers 51, thus deteriorating the packing density of the integrated circuit. In order to avoid such deterioration in packing density, the upper interconnecting layer 51 must be formed from material differing from that of the first conductive plug 40.

SUMMARY OF THE INVENTION

The present invention has been conceived to solve the problem as set forth and is aimed at providing a method of manufacturing a semiconductor device which enables facilitated formation of a plug and an interconnection simultaneously in a minute pattern when forming a conductive plug in a contact hole and forming an interconnection in a trench. Thus, a high-integration semiconductor device is manufactured.

According to one aspect of the present invention, a semiconductor device comprises a semiconductor substrate, a first semiconductor element having a first gate electrode and a pair of active regions by the gate electrode, an a second semiconductor element having a second gate electrode and a pair of active regions by the gate electrode. An isolating layer is formed on the semiconductor substrate to isolate the first and second semiconductor elements. An interlayer insulating film is formed on the semiconductor substrate. A first conductive plug is formed in the interlayer insulation film and on the isolating layer, and the first conductive plug electrically connects one of the active regions of the first semiconductor element and one of the active regions of the second semiconductor element.

According to another aspect of the present invention, a semiconductor device comprises a semiconductor substrate, a first semiconductor element having a first gate electrode and a pair of active regions by the gate electrode, and a second semiconductor element having a second gate electrode and a pair of active regions by the gate electrode. An isolating layer is formed on the semiconductor substrate to isolate the first and second semiconductor elements. A conductive line is formed on said isolating layer. An interlayer insulating film is formed on the semiconductor substrate. Further, a first conductive plug is formed in the interlayer insulating film and on the isolating layer, and the first conductive plug electrically connects said conductive line and at least one of the active regions of the first semiconductor element or the second semiconductor element.

Other and further objects, features and advantages of the present invention will appear more fully from the following description.

DETAILED DESCRIPTION OF THE PREFERRED EMBODIMENTS

Figure 1:
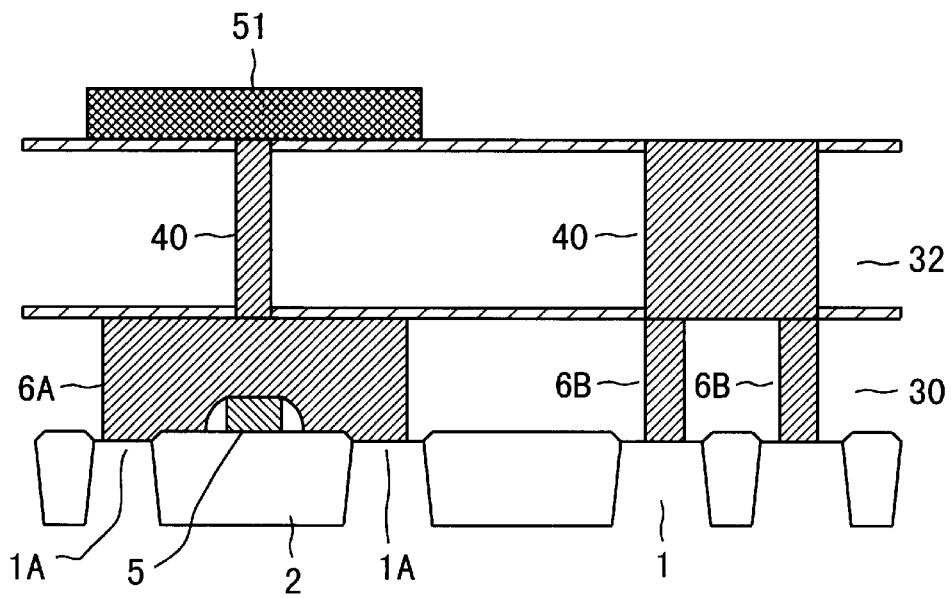
FIG. 1 is a cross-sectional view of a semiconductor device according to a first embodiment of the present invention.

Preferred embodiments of the present invention will be described in detail with reference to the accompanying drawings. In the drawings, the same or counter portions are designated by same reference numerals and their detailed description will be simplified or omitted.

First Embodiment

Figure 20:
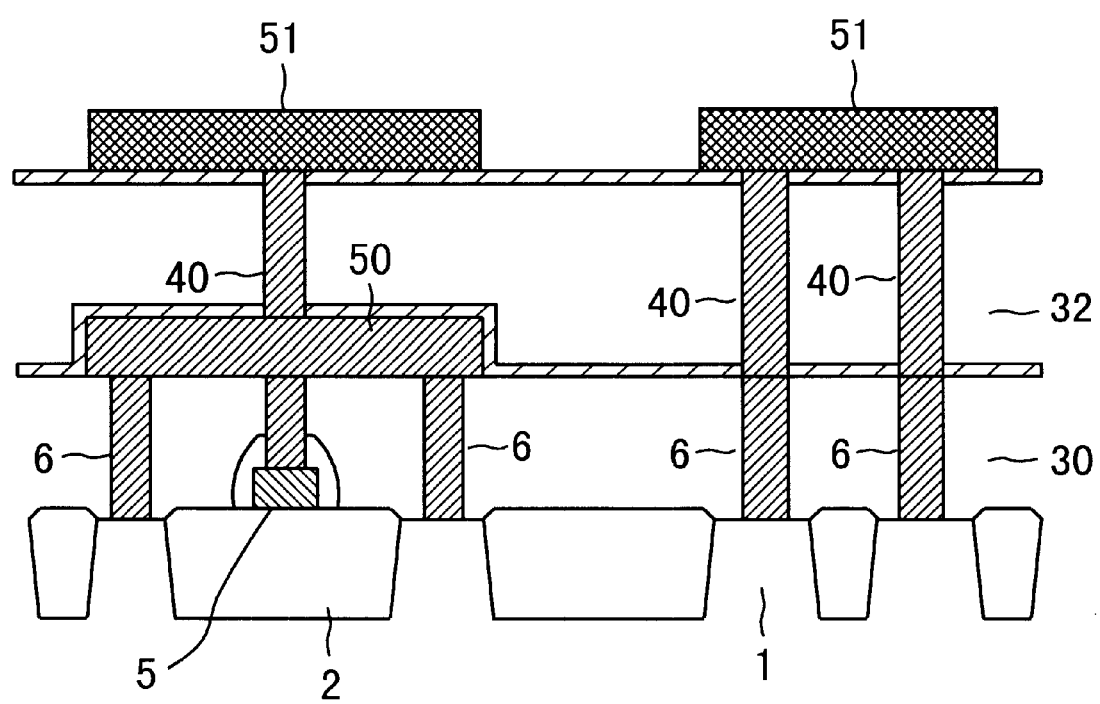
FIG. 20 is a cross-sectional view of a conventional semiconductor device.

A first embodiment of the present invention will be described hereinbelow by reference to the accompanying drawings. FIG. 1 is a cross-sectional view for describing the principal section of a semiconductor device 100 of the first embodiment. The semiconductor device 100 shown in FIG. 1 is drawn so as to correspond to the conventional semiconductor device 100C shown in FIG. 20.

In FIG. 1, reference numeral 1 designates a silicon substrate or a semiconductor substrate; 2 designates an isolation oxide film (isolating layer); 5 designates a gate electrode of a MOSFET as an example of a semiconductor element; 6A designates a lower and linear conductive plug (a first conductive plug); 6B designates other lower conductive plug (second conductive plug); 30 designates a lower interlayer dielectric film (an interlayer insulating film); 32 designates an upper interlayer dielectric film (an interlayer insulating film); 40 designates an upper conductive plug; 51 designates an upper interconnecting layer.

In the semiconductor device 100 of the present embodiment, a field-effect transistor (MOSFET), not shown, is formed on the semiconductor substrate 1, isolated by the isolation oxide film 2 provided in a silicon substrate 1, and its gate electrode 5 runs on the isolation oxide film 2. The first conductive plug 6A is formed in contact with the gate electrode 5 in the lower interlayer dielectric film 30. Thus, the first conductive plug 6A electrically connects the gate electrode 5 and active regions 1A, 1A located to either side thereof.

The semiconductor device of the present embodiment is characterized in that the first conductive plug 6A does not assume a form of a single contact hole such as that formed in the conventional semiconductor device (see FIG. 20), but assumes a form of a linear shape opening (see left side of FIG. 1).

Further, the semiconductor device of the present embodiment is characterized in that a upper conductive plug 40 connected to the two first conductive plugs 6B establishes electrical connection therebetween within an upper interlayer dielectric film 32 (see right side of FIG. 1).

As mentioned above, in the present embodiment, the first conductive plug 6A (left side of FIG. 1) provided in the lower interlayer dielectric film 30 and an upper conductive plug 40 (right side of FIG. 1) formed in the upper interlayer dielectric film 32 work as interconnecting layers, thereby enabling omission of additional upper interconnections, which would otherwise be required. Thus, the semiconductor device of the present embodiment yields an advantage of implementing high integration of interconnecting layers and shortening a manufacturing process.

In summary, one aspect of the present embodiment may be stated as follows. In a semiconductor device, an isolating layer 2 is formed on the semiconductor substrate 1. First and second active regions 1A, 1A are formed being separated by the isolating layer 2. An interlayer insulating film 30 is formed on the semiconductor substrate 1. A line-shaped conductive plug 6A is formed in the interlayer insulation film 30 and on the isolating layer 2, and the conductive plug 6A electrically connects the first and second active regions 1A, 1A.

Further, another aspect of the present embodiment may be stated as follows. In a semiconductor device, an isolating layer 2 is formed on the semiconductor substrate 1. First and second active regions 1A, 1A are formed being separated by the isolating layer 2. A linear conductive line 5 is formed on the isolating layer 2. An interlayer insulating film 30 is formed on the semiconductor substrate 1. A line-shaped conductive plug 6A is formed in the interlayer insulation film 30 and on the isolating layer 2, and the conductive plug 6A electrically connects the linear conductive line 5 and the first and second active regions 1A, 1A.

Second Embodiment

Figure 2A:
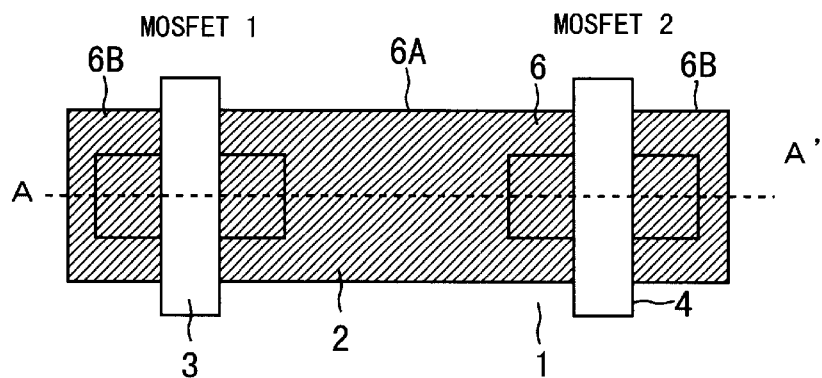
FIG. 2A is a top view of a semiconductor device according to a second embodiment of the present invention.

A second embodiment of the present invention will be described in detail by reference to the accompanying drawings. FIG. 2A is a top view for describing the principal section of the semiconductor device 100 according to a second embodiment of the present invention, and FIG. 2B is a cross-sectional view taken along line A–A' shown in FIG. 2A.

Figure 2B:
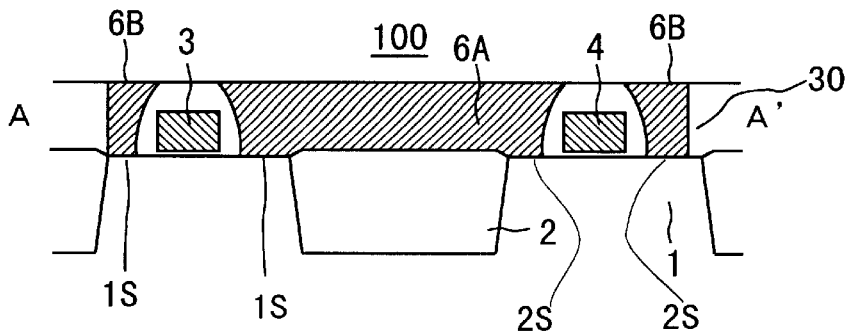
FIG. 2B is a cross-sectional view taken along line 2B–2B' shown in FIG. 2A.

In FIGS. 2A and 2B, reference numeral 3 designates a gate electrode of a MOSFET 1 formed on the silicon substrate 1, and reference numerals 1S, 1S designate its active regions respectively. Reference numeral 4 designates a gate electrode of another MOSFET 2 formed on the silicon substrate 1, and reference numerals 2S, 2S designate its active regions respectively. The active regions may be a source or a drain region of the MOSFETs.

Next will be described lowest conductive plugs, i.e. the line-shaped conductive plug 6A (first conductive plug) as an interconnection and other conventional conductive plug 6B (second conductive plug). As shown in FIGS. 2A and 2B, the MOSFETs 1, 2 are isolated from each other by the isolation oxide film 2 provided in the silicon substrate 1. The semiconductor device 100 of the present embodiment is characterized in that the conductive plug 6A interconnects an active region 1S (source) of one MOSFET 1 and an active region 2S (drain) of another MOSFET 2, and that each of the second conductive plugs 6A, 6B are separated from each other by the gate electrodes 3 and 4. In other words, the linear conductive plug 6A terminates before reaching the gates 3 and 4. The conductive plugs 6A, 6B are desirably formed from silicon, silicide, or metal.

As mentioned above, the present embodiment yields an advantage of forming a large opening for the conductive plug 6A, thereby eliminated is a more minute pattern than the gate electrode 5.

In summary, one aspect of the present embodiment may be stated as follows. In a semiconductor device, a first semiconductor element MOSFET 1, having a first gate electrode 3 and a pair of active regions 1S, 1S by the gate electrode 3, is formed on a semiconductor substrate 1. A second semiconductor element MOSFET 2, having a second gate electrode 4 and a pair of active regions 2S, 2S by the gate electrode 4, is formed on the semiconductor substrate 1. An isolating layer 2 is formed on the semiconductor substrate 1 to isolate the first and second semiconductor elements MOSFET 1 and 2. An interlayer insulating film 30 is formed on the semiconductor substrate 1. A first conductive plug 6A is formed in the interlayer insulation film 30 and on the isolating layer 2. The first conductive plug 6A electrically connects one of the active regions 1S of the first semiconductor element MOSFET 1 and one of the active regions 2S of the second semiconductor element MOSFET 2.

Third Embodiment

Figure 3A:
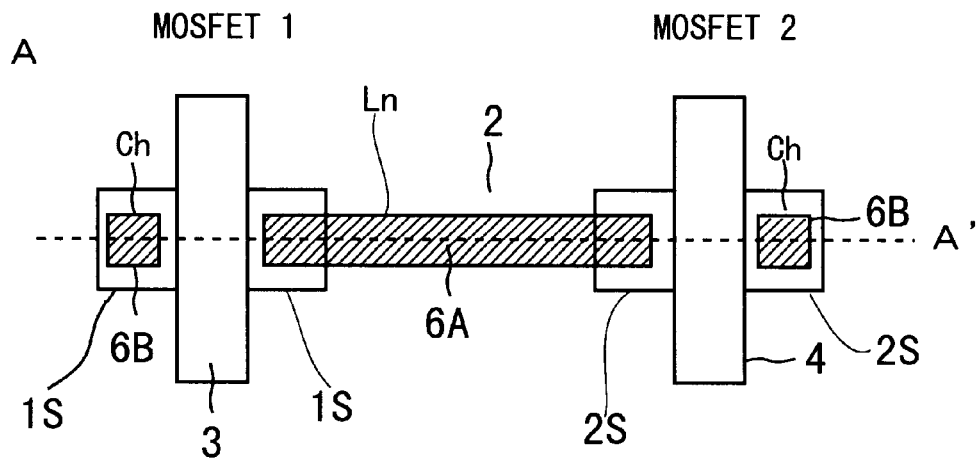
FIG. 3A is a top view of a semiconductor device of a third embodiment.

A third embodiment of the present invention will be described in detail by reference to the accompanying drawings. FIG. 3A is a top view for describing the principal section of the semiconductor device 100 of the third embodiment, and FIG. 3B is a cross-sectional view taken along line 3B–3B' shown in FIG. 3A.

Figure 3B:
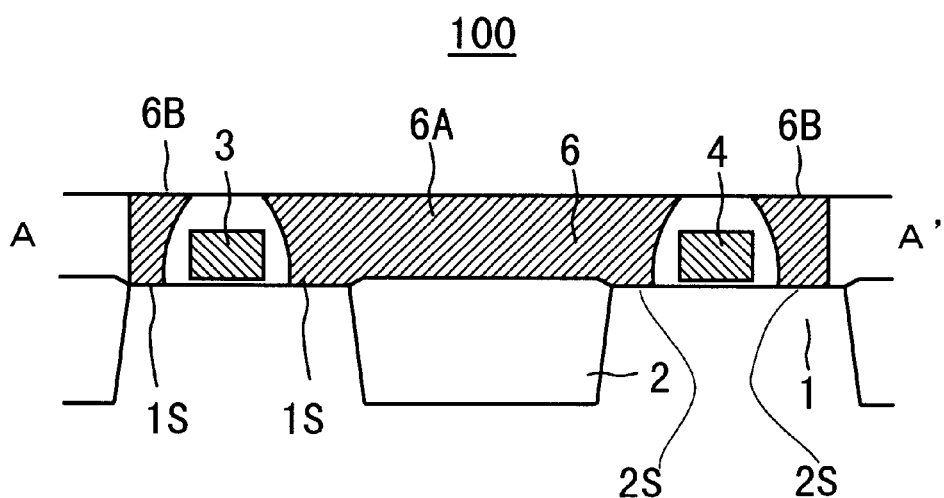
FIG. 3B is a cross-sectional view taken along line 3B–3B' shown in FIG. 3A.

As shown in FIGS. 3A and 3B, a shorter side of an opening Ln for the conductive plug 6A, serving as an interconnection, substantially matches the dimension (i.e. a diameter) of a contact hole Ch for the conductive plug 6B. As a result, etchback performed after embedding the conductive plugs 6A and 6B in the opening Ln and contact holes Ch is facilitated, and interconnections can be made much narrower. Consequently, the present embodiment yields an advantage of reducing parasitic capacitance between the silicon substrate 1.

Fourth Embodiment

Figure 4:
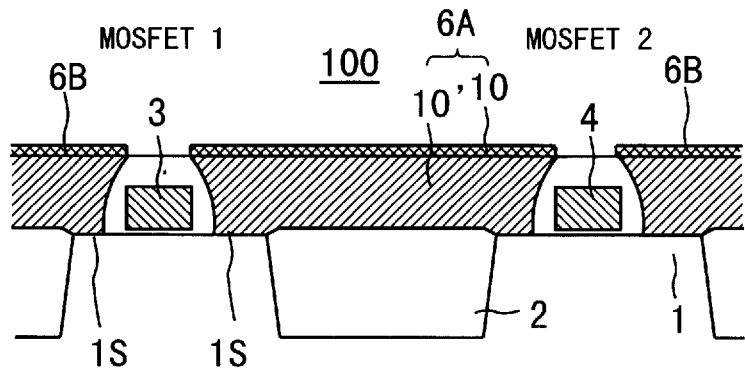
FIG. 4 is a cross-sectional view of a semiconductor device of a fourth embodiment.

A fourth embodiment of the present invention will be described in detail by reference to the accompanying drawings. FIG. 4 is a cross-sectional view for describing the principal section of the semiconductor device 100 of the third embodiment.

In FIG. 4, reference numeral 10 designates an upper (low resistance) conductive layer of the conductive plugs 6A and 6B, and 10' designates a lower conductive layer of the conductive plugs 6A and 6B.

As shown in FIG. 4, the semiconductor device 100 of the present embodiment is characterized in that the conductive plug 6A is formed from two layers: i.e., a lower conductive layer 10' and an upper conductive layer 10.

As shown in FIG. 4, the MOSFETs 1 and 2 are isolated from each other by means of the isolation oxide film 2 provided in the silicon substrate 1. The semiconductor device 100 of the fourth embodiment is characterized in that the lower conductive layer 10' interconnects an active region 1S (source) of one MOSFET 1 and an active region 2S (drain) of another MOSFET 2. The upper low resistance conductive layer 10 is formed on the lower conductive layer 10'.

The lower conductive layers 10' terminates before reaching the gate electrodes 3 and 4. Namely, each of the lower conductive layers 10' are isolated from each other by means of the gate electrodes 3 and 4. The lower conductive layer 10' is desirably formed from silicon, silicide, or metal (for instance, an alloy or single metal).

In a case where the lower conductive plug 10' is formed from polysilicon, the resistance of the interconnection is slightly high. In order to reduce the resistance of the interconnection, a layer formed from silicide, Si (silicon), or a metal, such as W (tungsten), Co (cobalt), or Ti (titanium), is desirably used as the upper conductive layer 10, thus increasing the operation speed of the semiconductor device 100. The same effect as yielded in the previous embodiments is also achieved even when the conductive plug 6 is formed into a multilayer structure including three or more layers.

As mentioned above, an opening for the lower conductive plug 10' can be formed large as in the second embodiment. Therefore, it is not necessary in the present embodiment to form a fine pattern which is more minute than the gate electrode 5 or the isolation layer 2.

Fifth Embodiment

Figure 5:
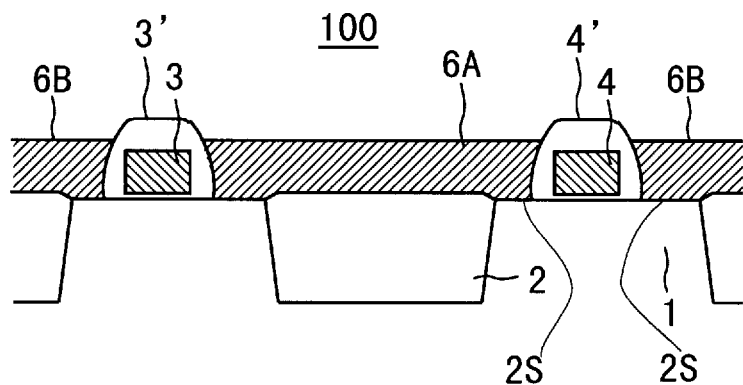
FIG. 5 is a cross-sectional of a semiconductor device of a fifth embodiment.

A fifth embodiment of the present invention will be described in detail by reference to the accompanying drawings. FIG. 5 is a cross-sectional view for describing the principal section of the semiconductor device 100 of the fifth embodiment. In FIG. 5, reference numerals 3' and 4' designate dielectric films (cover insulation film) covering the gate electrodes 3 and 4 respectively.

As shown in FIG. 5, the semiconductor device 100 of the present embodiment is characterized in that the upper surface of the conductive plug 6A and 6B is lower than the upper surface of the dielectric film 3' and 4' formed around the gate electrode 3 and 4 respectively. Such a configuration in which the cover dielectric films 3' and 4' protrude from the upper surface of the conductive plug 6A and 6B enables a reduction in parasitic capacitance arising between the conductive plugs 6A, 6B and the gate electrodes 3, 4, thereby yielding an advantage of increasing the operation speed of the semiconductor device 100.

Sixth Embodiment

Figure 6:
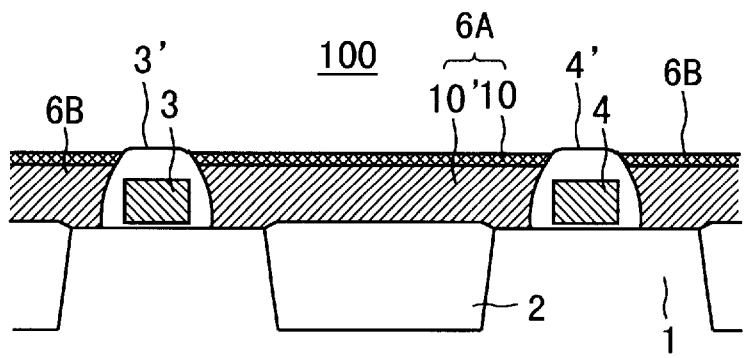
FIG. 6 is a cross-sectional view of a semiconductor device of a sixth embodiment.

A sixth embodiment of the present invention will be described in detail by reference to the accompanying drawings. FIG. 6 is a cross-sectional view for describing the principal section of the semiconductor device 100 of the sixth embodiment.

As shown in FIG. 6, each dielectric film 3' and 4' is formed around the gate electrodes 3 and 4 respectively, and the conductive plug 6A and 6B are formed of a two layer structure with a lower conductive layer 10' and an upper conductive layer 10. The semiconductor device 100 of the present embodiment is characterized in that the upper surface of the upper conductive layer 10 is formed to be lower than the upper surface of the dielectric film 3' and 4'. Such a configuration in which the dielectric films 3' and 4' protrude from the upper surface of the upper conductive layer 10 of the conductive plug 6A, 6B enables a reduction in parasitic capacitance arising between the conductive plugs 6A, 6B and the gate electrodes 3, 4, thereby yielding an advantage of increasing the operation speed of the semiconductor device 100.

In the present embodiment, in a case where the lower conductive layer 10' of the conductive plug 6A is formed from polysilicon, the resistance of an interconnection is slightly high. In order to reduce the resistance of the interconnection, a layer formed from silicide, Si (silicon), a metal, such as W (tungsten), Co (cobalt), or Ti (titanium), is desirably used as the upper conductive layer 10 of the conductive plug 6A, thus increasing the operation speed of the semiconductor device 100. The same effects as that yielded in the previous embodiments is also achieved even when the second conductive plug 6A of the present embodiment is formed into a multilayer structure including three or more layers.

Seventh Embodiment

Figure 7:
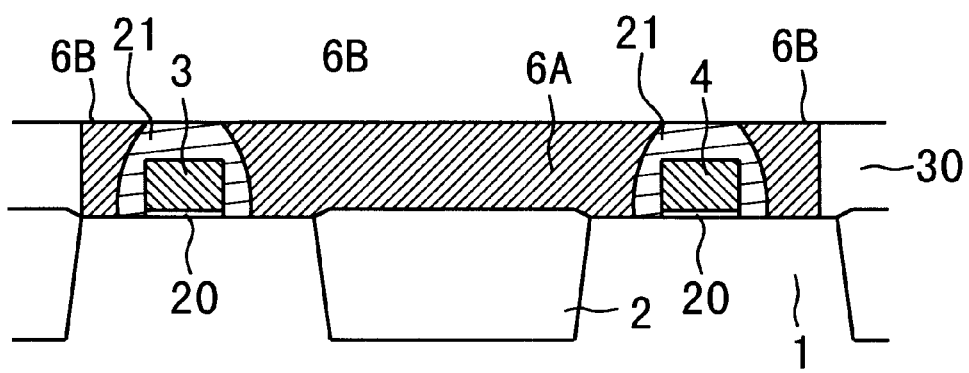
FIG. 7 is a cross-sectional view of a semiconductor device of a seventh embodiment.

A seventh embodiment of the present invention will be described in detail by reference to the accompanying drawings. FIG. 7 is a cross-sectional view for describing the principal section of the semiconductor device 100 of the seventh embodiment. In FIG. 7, reference numeral 20 designates a silicon oxide film as a gate insulating film (surface insulation film), and 21 designates a dielectric film as a sidewall (cover insulation film) for the gate electrode 3 and 4. The dielectric film 21 is formed of a silicon nitride film.

As shown in FIG. 7, the semiconductor device 100 of the present embodiment is characterized in that a sidewall 21 formed from a nitride film, which encloses each of the gate electrodes 3 and 4, is formed from material differing from that used for forming the element isolation oxide film 2 and the lower and upper interlayer dielectric films 30 or 32.

The above structure is realized in a case where there is employed a trench isolation structure in which an oxide film is embedded for isolation purpose or a LOCOS structure is formed from a thermal oxide film, and the silicon nitride film is formed for the sidewall.

As mentioned above, the sidewall 21 is formed from a material differing from that used for forming the dielectric film for isolation purpose (the isolation oxide film 2) and the interlayer dielectric films (the lower and upper interlayer dielectric films 30 and 32). Therefore, an etching selectivity is obtained in an etching process, so that depression of the isolation oxide film 2 may be prevented, which would otherwise adversely affect the characteristic of isolation between the elements. Further, use of such a structure ensures isolation characteristics.

Eighth Embodiment

Figure 8:
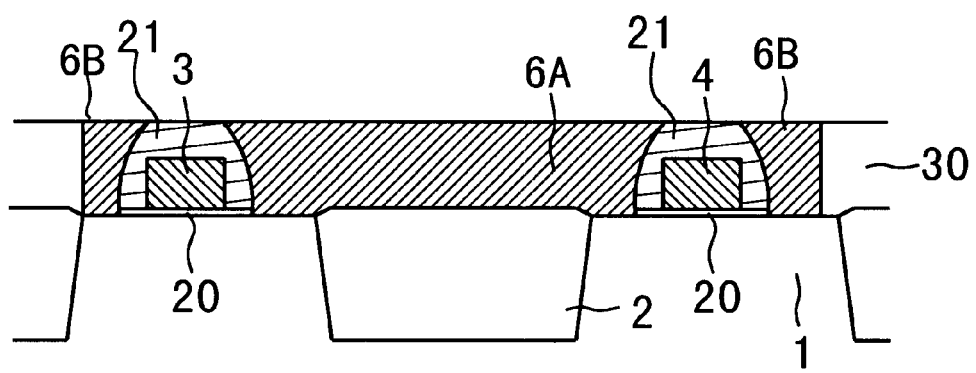
FIG. 8 is a cross-sectional view of a semiconductor device of an eighth embodiment.

An eighth embodiment of the present invention will be described in detail by reference to the accompanying drawings. FIG. 8 is a cross-sectional view for describing the principal section of the semiconductor device 100 of the eighth embodiment.

As shown in FIG. 8, in contrast with the semiconductor device 100 of the seventh embodiment (see FIG. 7), the semiconductor device 100 of the present embodiment is characterized in that the silicon oxide film 20 (surface insulation film) is formed under the side wall 21 (a nitride film as a cover insulation film), as well as under the lower surfaces of the respective gate electrodes 3 and 4, to thereby prevent direct contact between the sidewall 21 (nitride film) and the silicon substrate 1.

The present embodiment yields an advantage of isolating a nitride film having a high boundary level, which affects the operation of a MOSFET, from the source/drain regions or a gate edge of the MOSFET.

Ninth Embodiment

Figure 9A:
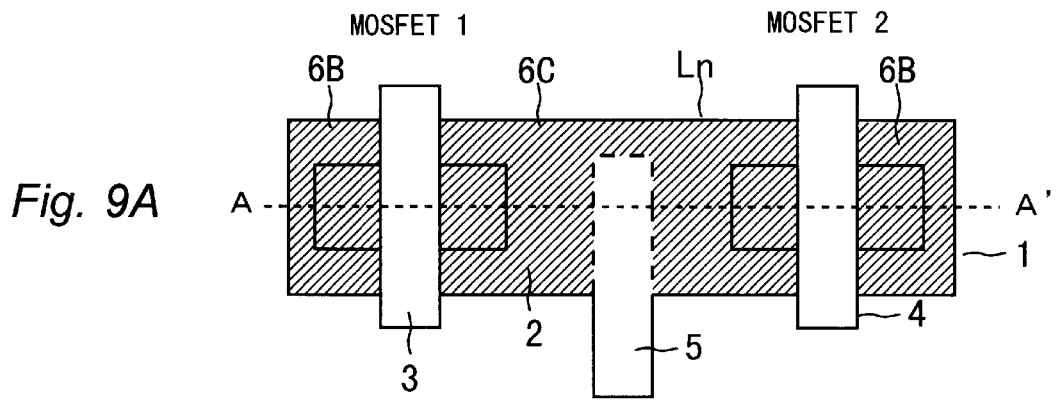
FIG. 9A is a top view of a semiconductor device according to a ninth embodiment of the present invention.

A ninth embodiment of the present invention will be described in detail by reference to the accompanying drawings. FIG. 9A is a top view for describing the principal section of the semiconductor device 100 according to the ninth embodiment of the present invention, and FIG. 9B is a cross-sectional view taken along line 9B–9B' shown in FIG. 9A.

Figure 9B:
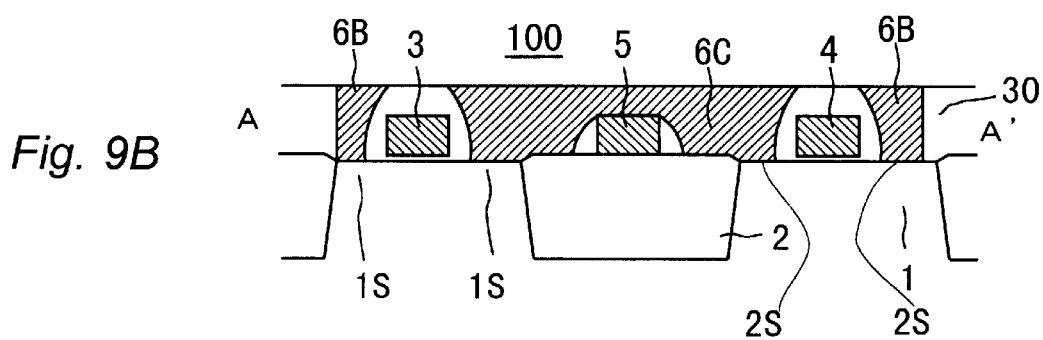
FIG. 9B is a cross-sectional view taken along line 9B–9B' shown in FIG. 9A.

In FIGS. 9A and 9B, reference numeral 5 designates a gate electrode (conductive line) of a MOSFET (not shown) as an example of a semiconductor element; 6C designates a linear conductive plug (third conductive plug); 6B designates conventional conductive plugs (second conductive plug); and 30 designates a lower interlayer dielectric film (interlayer insulating film).

As shown in FIG. 9B, the semiconductor device 100 of the ninth embodiment is characterized in that the gate electrode 5 provided on the isolation oxide film 2 is in contact with a conductive plug 6C. The conductive plug 6C is formed by removing the interlayer insulating film 30 on the isolation layer 2. Thus, the first conductive plug 6A electrically connects the gate electrode 5 and active regions 1S, 2S located on either side thereof.

The third conductive plug 6C is formed in contact with the gate electrode 5 in the interlayer dielectric film 30. Thus, the third conductive plug 6C electrically connects the gate electrode 5 and active regions 1S, 2A located to either side thereof.

The semiconductor device of the present embodiment is characterized in that the third conductive plug 6C does not assume a form of a conventional contact hole such as that formed in the conventional semiconductor device (see FIG. 20), but assumes a form of a linear shape opening.

As mentioned above, in the present embodiment, the third conductive plug 6C provided in the interlayer dielectric film 30 works as an interconnecting layer, thereby enabling omission of additional upper interconnections, which would otherwise be required. Thus, the semiconductor device of the present embodiment yields an advantage of implementing high integration of interconnecting layers and shortening a manufacturing process.

In summary, one aspect of the present embodiment may be stated as follows. In a semiconductor device, a first semiconductor element MOSFET 1, having a first gate electrode 3 and a pair of active regions 1S, 1S by the gate electrode 3, is formed on a semiconductor substrate 1. A second semiconductor element MOSFET 2, having a second gate electrode 4 and a pair of active regions 2S, 2S by the gate electrode 4, is formed on the semiconductor substrate 1. An isolating layer 2 is formed on the semiconductor substrate 1 to isolate the first and second semiconductor elements MOSFET 1 and 2. A conductive line 5 is formed on the isolating layer 2. An interlayer insulating film 30 is formed on the semiconductor substrate 1. A third conductive plug 6C is formed in the interlayer insulation film 30 and on the conductive line 5 and the isolating layer 2. The third conductive plug 6C electrically connects the conductive line 5 and at least one of the active regions 1S, 2S of the first semiconductor element MOSFET 1 or the second semiconductor element MOSFET 2.

Tenth Embodiment

Figure 10A:
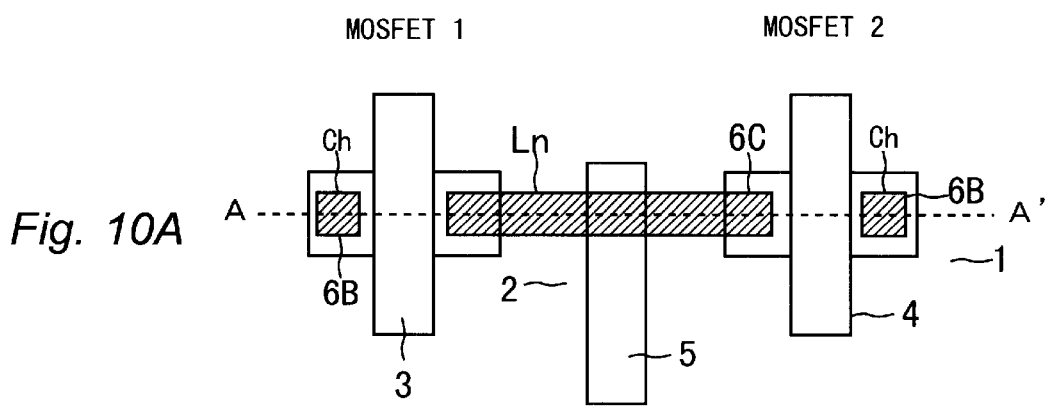
FIG. 10A is a top view of a semiconductor device according to a tenth embodiment of the present invention.

A tenth embodiment of the present invention will be described in detail by reference to the accompanying drawings. FIG. 10A is a top view for describing the principal section of the semiconductor device 100 according to the tenth embodiment of the present invention, and FIG. 10B is a cross-sectional view taken along line 10B–10B' shown in FIG. 10A.

Figure 10B:
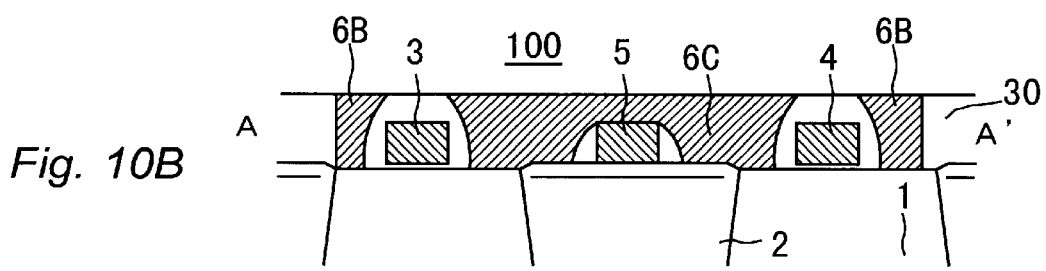
FIG. 10B is a cross-sectional view taken along line 10B–10B' shown in FIG. 10A.

As shown in FIGS. 10A and 10B, the semiconductor device 100 of the present embodiment is characterized in that the length of the shorter side of an opening Ln for the conductive plug 6C, serving as an interconnection, substantially matches the dimension (diameter) of a contact hole Cn for the second conductive plug 6B. As a result, etchback performed after the conductive plugs 6B, 6C have been embedded in the opening Ln and in the contact holes Ch is facilitated, and interconnections can be made much narrower. Consequently, the present embodiment yields an advantage of reducing parasitic capacitance arising between the conductive plugs 6B, 6C and the silicon substrate 1.

Eleventh Embodiment

Figure 11A:
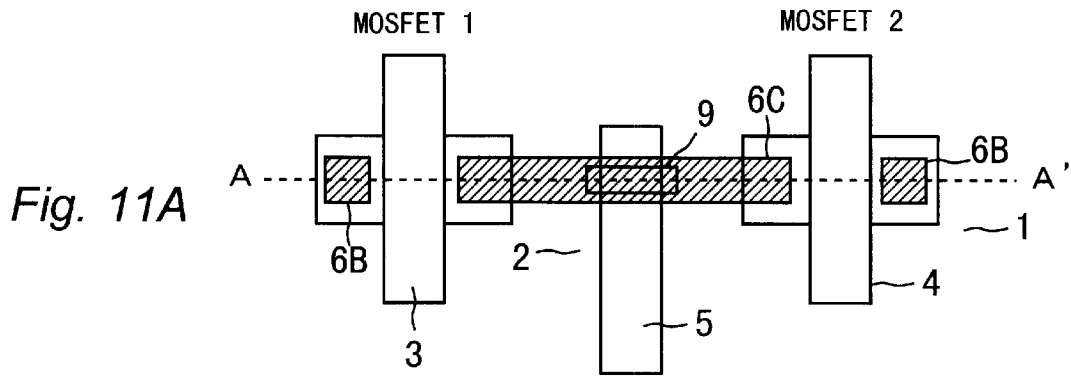
FIG. 11A is a top view of a semiconductor device according to an eleventh embodiment of the present invention.
Figure 11B:
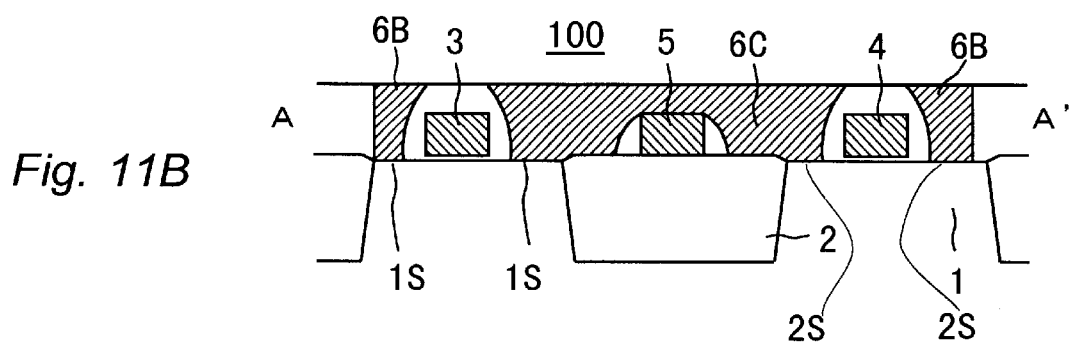
FIG. 11B is a cross-sectional view taken along line 11B–11B' shown in FIG. 11A.

An eleventh embodiment of the present invention will be described in detail by reference to the accompanying drawings. FIG. 11A is a top view for describing the principal section of the semiconductor device 100 according to the eleventh embodiment of the present invention, and FIG. 11B is a cross-sectional view taken along line 11B–11B' shown in FIG. 11A. In FIG. 11A, reference numeral 9 designates an opening formed in the contact plug 6C.

As shown in FIG. 11B, the semiconductor device 100 is characterized in that an opening 9 is formed in the top of the conductive plug 6C in a separate process, for the purpose of ensuring establishment of electrical contact on the gate electrode 5. As a result, etchback performed after the conductive plugs 6B, 6C have been embedded in the linear opening Ln and the contact holes Ch is facilitated, and interconnections can be made much narrower. Consequently, the present embodiment yields an advantage of reducing parasitic capacitance of the conductive plugs 6B, 6C.

Twelfth Embodiment

Figure 12:
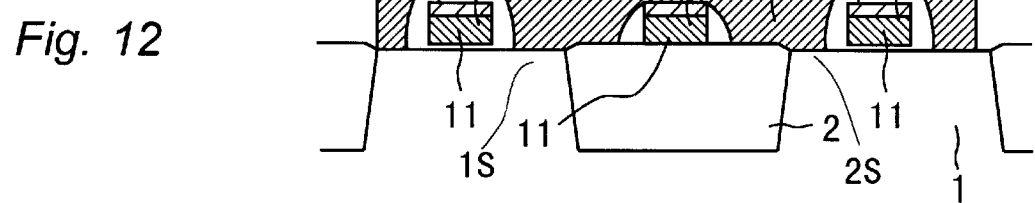
FIG. 12 is a cross-sectional view of a semiconductor device of a twelfth embodiment.

A twelfth embodiment of the present invention will be described in detail by reference to the accompanying drawings. FIG. 12 is a cross-sectional view for describing the principal section of the semiconductor device 100 of the twelfth embodiment. In FIG. 12, reference numeral 11 designates a lower conductive layer of the gate electrodes 3, 4 and the conductive line 5, and 11' designates an upper conductive layer of the gate electrode 3, 4 and conductive line 5 respectively.

As shown in FIG. 12, the semiconductor device 100 of the present embodiment is characterized in that each of the gate electrodes 3, 4, and 5 is formed into a two-layer structure of a lower conductive layer 11 and an upper low resistance conductive layer 11', and electrical contact to the gate electrodes 3, 4, and 5 is established on the upper conductive layer 11' respectively. In this case, each gate electrode 3, 4 and 5 is formed by combination of polysilicon for the lower conductive layer 11 and silicide for the upper conductive layer 11', and shows low resistance. Therefore, electrical contact can be established on the low resistance conductive layer 11' which maintains a merit of the two-layer structure. Although the gate electrodes 3, 4, and 5 have been described as being of a two-layer structure, the present invention is not limited to such a structure. The same effect as that yielded in the previous embodiments is also yielded in a case where the gate electrodes assume a multilayer structure of three or more layers.

Thirteenth Embodiment

Figure 13:
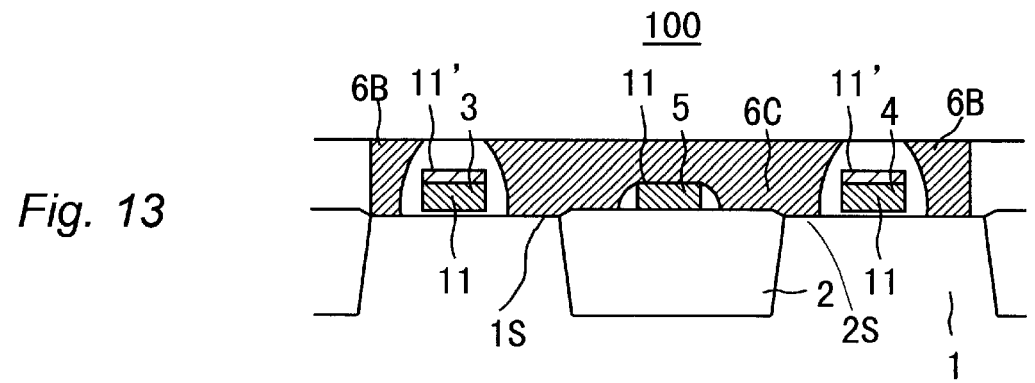
FIG. 13 is a cross-sectional view of a semiconductor device of a thirteenth embodiment.

A thirteenth embodiment of the present invention will be described in detail by reference to the accompanying drawings. FIG. 13 is a cross-sectional view for describing the principal section of the semiconductor device 100 of the thirteenth embodiment.

As shown in FIG. 13, in the semiconductor device 100 of the present embodiment, gate electrode 5 connected to the conductive plug 6C does not employ the multilayer structure as shown in FIG. 12 of the twelfth embodiment. The present embodiment is characterized in that each of the gate electrodes 3 and 4 has a two-layer structure comprising polysilicon for the lower conductive layer 11 and polycide for the upper conductive layer 11', and the gate electrode 5 has a single layer structure comprising polysilicon for the first electrode layer 11. The polycide for the upper conductive layer 11' is removed from the top of the gate electrode 5.

In some case, polycide for the upper conductive layer 11' may not allow good ohmic contact with polysilicon for the conductive plug 6C. The present embodiment is adopted particularly in such a case where a contact region is desired to be free of polycide.

Although the gate electrodes 3 and 4 have been described as being of a two-layer structure comprising the lower conductive layer 11 and the upper conductive layer 11', the present invention is not limited to such a structure. The same effect as that yielded in the previous embodiments is also yielded in a case where the gate electrode 5 assume multilayer structure of three or more layers, so long as at least one polycide layer is removed from a gate contact area of the gate electrode 5.

Fourteenth Embodiment

Figure 14:
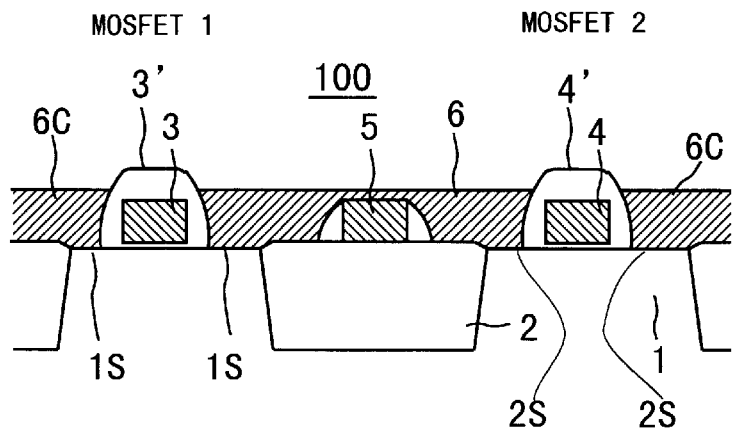
FIG. 14 is a cross-sectional view of a semiconductor device of a fourteenth embodiment.

A fourteenth embodiment of the present invention will be described in detail by reference to the accompanying drawings. FIG. 14 is a cross-sectional view for describing the principal section of the semiconductor device 100 of the fourteenth embodiment.

As shown in FIG. 14, in the semiconductor device 100 of the present embodiment, a gate contact structure is added to the semiconductor device as described in FIG. 5. The semiconductor device 100 of the present embodiment is characterized in that the upper surface of the conductive plug 6C is lower than the upper surface of the dielectric film 3' and 4' formed around the gate electrode 3 and 4 respectively. Such a configuration in which the upper dielectric films 3' and 4' protrude from the upper surface of the conductive plug 6C enables a reduction in parasitic capacitance arising between the conductive plug 6C and the gate electrodes 3 and 4, thereby yielding an advantage of increasing the operation speed of the semiconductor device 100.

Fifteenth Embodiment

Figure 15:
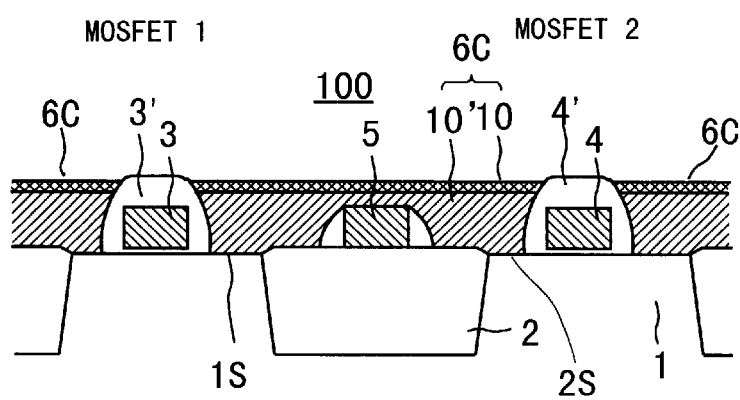
FIG. 15 is a cross-sectional view of a semiconductor device of a fifteenth embodiment.

A fifteenth embodiment of the present invention will be described in detail by reference to the accompanying drawings. FIG. 15 is a cross-sectional view for describing the principal section of the semiconductor device 100 of the fifteenth embodiment.

As shown in FIG. 15, the semiconductor device 100 of the present embodiment is characterized in that a gate contact structure is adopted for the gate electrode 5 in the semiconductor device 100 shown in FIG. 6.

In the semiconductor device 100 of the present embodiment, the conductive plugs 6B, 6C are formed into a two-layer structure of the lower conductive layer 10' and an upper (low resistance) conductive layer 10. The upper surface of the upper conductive layer 10 is lowered than the dielectric film 3' and 4' of the gate electrodes 3 and 4. Such a configuration in which the dielectric films 3' and 4' protrude from the upper surface of the conductive plug 6B, 6C enables a reduction in parasitic capacitance arising between the gate electrodes 3 and 4 and the second conductive plugs 6B, 6C, thereby yielding the advantage of increasing the operation speed of the semiconductor device 100.

In the present embodiment, in a case where the lower conductive layer 10' is formed from polysilicon, the resistance of an interconnection is slightly high. In order to reduce the resistance of the interconnection, a layer formed from Si (silicon), silicide, or metal, such as W (tungsten), Co (cobalt), or Ti (titanium), is desirably used as the upper low resistance conductive layer 10, thus increasing the operation speed of the semiconductor device 100. The same effect as that yielded in the previous embodiments is also achieved when the conductive plugs 6B, 6C are formed into a multilayer structure including three or more layers.

Sixteenth Embodiment

Figure 16:
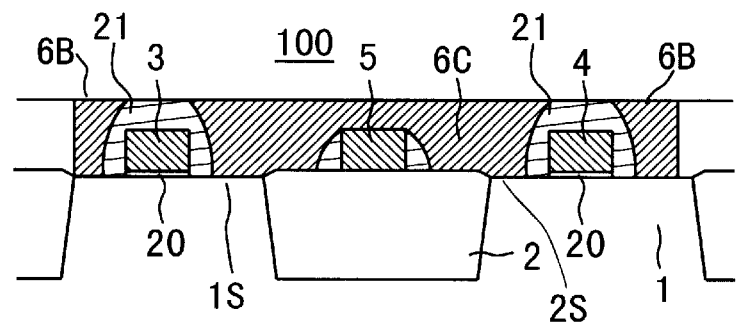
FIG. 16 is a cross-sectional view of a semiconductor device of a sixteenth embodiment.

A sixteenth embodiment of the present invention will be described in detail by reference to the accompanying drawings. FIG. 16 is a cross-sectional view for describing the principal section of the semiconductor device 100 of the sixteenth embodiment.

As shown in FIG. 16, the semiconductor device 100 of the present embodiment is characterized in that the gate contact structure is adopted for the gate electrode 5 in the semiconductor device shown in FIG. 7, and that the sidewall 21 (formed from a nitride film), around the gate electrodes 3, 4 and 5 is formed from material differing from that used for forming the isolation oxide film 2 and interlayer dielectric films such as the lower interlayer dielectric film 30 and the upper interlayer dielectric film 32.

The above structure is realized in a case where there is employed a trench isolation structure in which an oxide film is embedded for isolation purpose or a LOCOS structure is formed from a thermal oxide film, and the silicon nitride film is formed for the sidewall.

As mentioned above, the sidewall 21 is formed from a material differing from that used for forming the dielectric film for isolation purpose (the isolation oxide film 2) and the interlayer dielectric films (the lower and upper interlayer dielectric films 30 and 32). Therefore, an etching selectivity is obtained in an etching process, so that depression of the isolation oxide film 2 may be prevented, which would otherwise adversely affect the characteristic of isolation between the elements. Further, use of such a structure ensures isolation characteristics.

Seventeenth Embodiment

Figure 17:
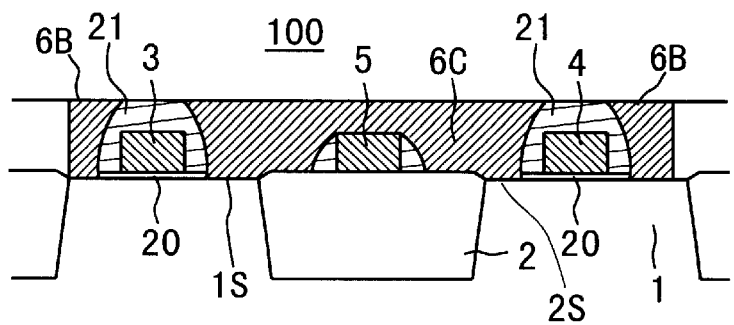
FIG. 17 is a cross-sectional view of a semiconductor device of a seventeenth embodiment.

A seventeenth embodiment of the present invention will be described in detail by reference to the accompanying drawings. FIG. 17 is a cross-sectional view for describing the principal section of the semiconductor device 100 of the seventeenth embodiment.

As shown in FIG. 17, the semiconductor device 100 of the present embodiment is characterized in that the gate contact structure is adopted for the gate electrode 5 for the semiconductor device shown in FIG. 8. The conductive plug 6C electrically connects the gate electrode 5 and the active regions 1S, 2S across the isolation layer 2.

Further, the semiconductor device 100 of the present embodiment is characterized in that the silicon oxide film 20 is formed under the side wall 21 (nitride film), as well as under the lower surfaces of the gate electrodes 3 and 4, to thereby prevent direct contact between the sidewall 21 (nitride film) and the silicon substrate 1.

The present embodiment yields the same advantage of isolating nitride film having a high boundary level, which affects the operation of a MOSFET, from the source/drain regions or a gate edge of the MOSFET.

Eighteenth Embodiment

An eighteenth embodiment of the present invention will be described in detail by reference to the accompanying drawings. FIGS. 18A to 18E are cross-sectional views for describing the manufacturing process of the semiconductor device 100 according to the eighteenth embodiment.

Figure 18A:
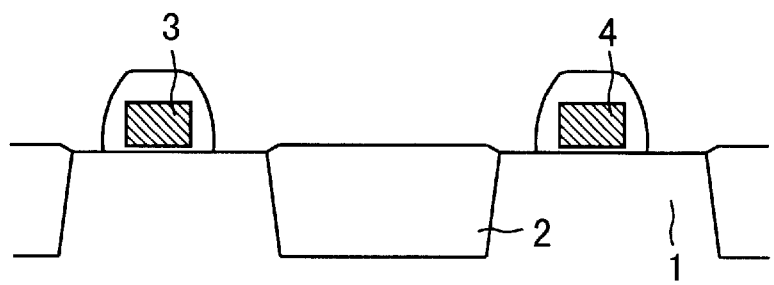
FIGS. 18A to 18E are cross-sectional views for describing a manufacturing process of a semiconductor device according to an eighteenth embodiment of the present invention.
Figure 18B:
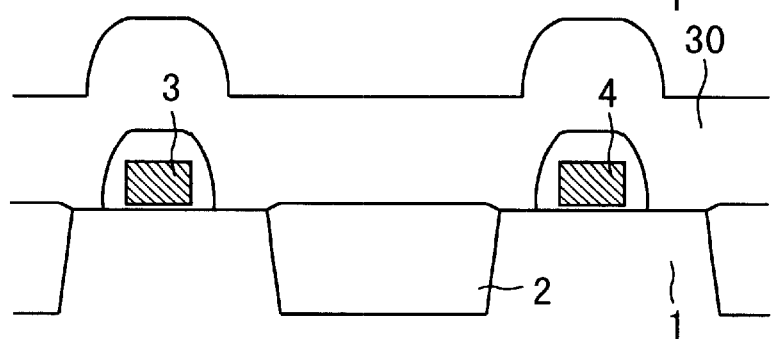
Figure 18C:
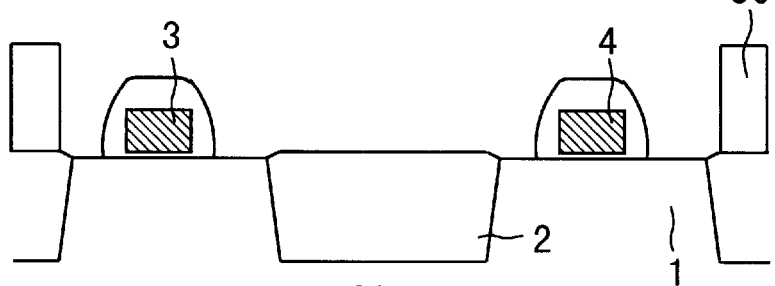
Figure 18D:
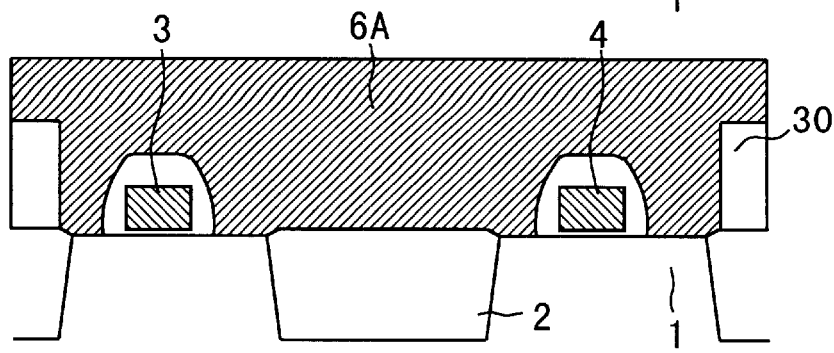
Figure 18E:
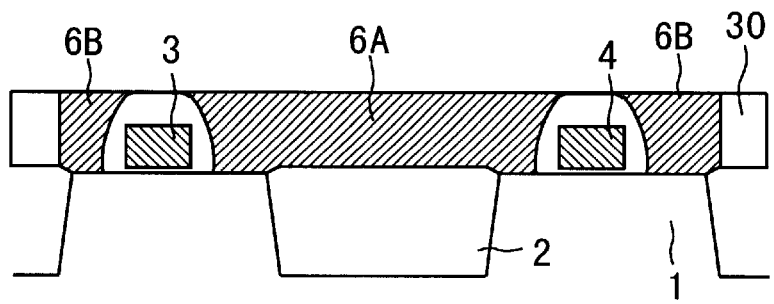

The present embodiment shows the flow of processes for manufacturing the semiconductor device 100 shown in FIG. 3. As shown in FIG. 18A, the isolation oxide film 2 is formed on the silicon substrate 1 (semiconductor substrate), and the gate electrodes 3 and 4 of a MOSFET are formed. Subsequently, as shown in FIG. 18B, processing of depositing the lower interlayer dielectric film 30 is performed. As shown in FIG. 18C, the process is followed by a process for forming an opening in the lower interlayer dielectric film 30 by means of the photolithography technique. As shown in FIG. 18D, there is performed a process of depositing conductive polysilicon as a conductive plugs. As shown in FIG. 18E, there is performed a process of smoothing the conductive plugs to form the conductive plug 6A (first conductive plug) and the other conductive plugs 6B (second conductive plug), by means of etchback.

As shown in FIG. 18E, in the present embodiment the conductive plug 6A and 6B is smoothed by means of etchback. However, the technique for smoothing the conductive plug is not limited to etchback. For example, the conductive plug 6A, 6B may be smoothed by means of chemical-mechanical polishing (CMP). Alternatively, the conductive plugs may be smoothed by CMP after an interlayer dielectric film 30 has been deposited in the process shown in FIG. 18B. In the process shown in FIG. 18D, polysilicon is used as material to be deposited. Material for deposition is not limited particularly to polysilicon, alternatively, a metal film, such as W (tungsten) or Co (cobalt), a silicide film, or a selective epitaxial film may be used as material for deposition. Alternatively, conductive plugs may be doped with impurities by means of diffusion, and the thus-doped conducive plugs may be used for constituting a portion of the source/drain region.

Nineteenth Embodiment

A nineteenth embodiment of the present invention will be described in detail by reference to the accompanying drawings. FIGS. 19A to 19E show the flow of processing steps for describing a method of manufacturing a semiconductor device according to the nineteenth embodiment.

Figure 19A:
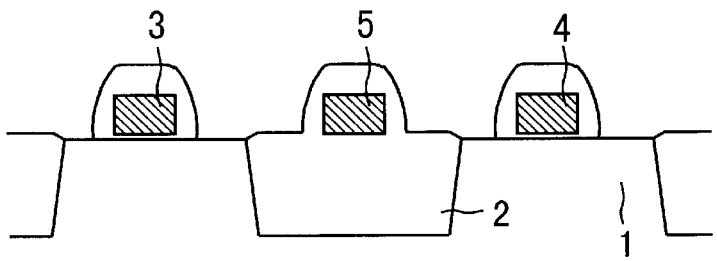
FIGS. 19A to 19E show processing steps of a method of manufacturing a semiconductor device according to a nineteenth embodiment of the present invention.
Figure 19B:
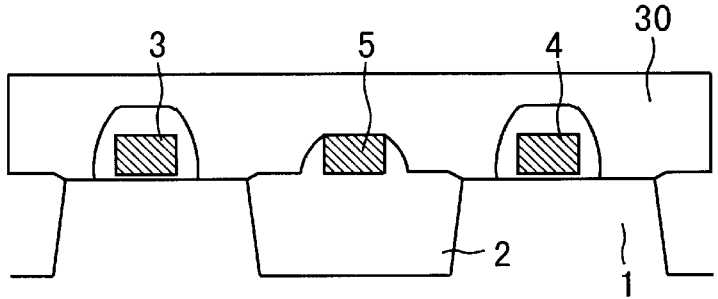
Figure 19C:
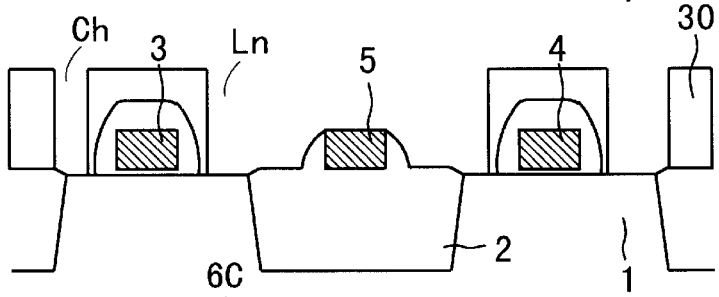
Figure 19D:
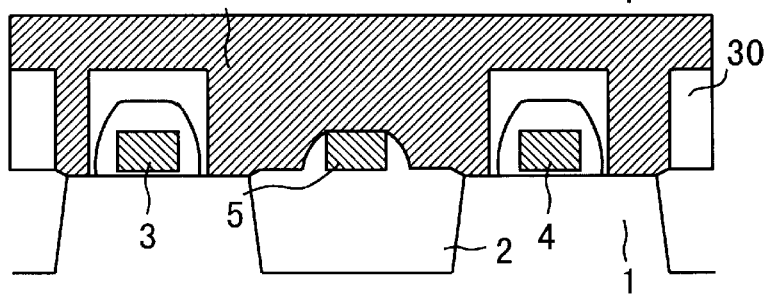
Figure 19E:
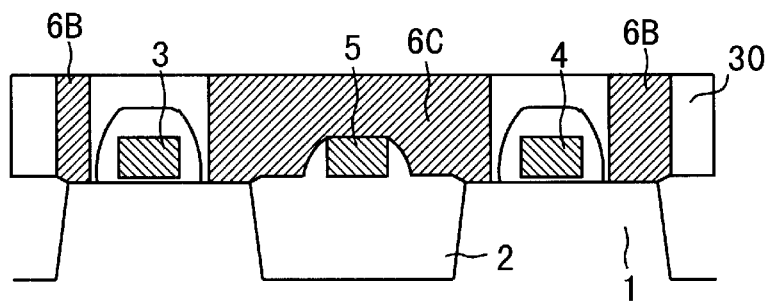

The present embodiment relates to the flow of steps for manufacturing the semiconductor device 100 shown in FIG. 10. As shown in FIG. 19A, there is performed processing pertaining to a step of forming the gate electrodes 3, 4, and 5. As shown in FIG. 19B, there is performed a step of depositing the lower interlayer dielectric film 30 and abrading the thus-deposited lower interlayer dielectric film 30 by means of CMP (a CMP smoothing step). Subsequently, as shown in FIG. 19C, there is performed a step of forming in the lower interlayer dielectric film 30 a line shaped opening Ln and contact holes Ch in which conductive plugs are to be embedded. As shown in FIG. 19D, there is performed a step of depositing material for the conductive plugs. As shown in FIG. 19E, there is performed a step of smoothing the thus-deposited conductive plugs to form a conductive plug 6C (third conductive plug) and other conductive plugs 6B (second conductive plug) by means of CMP.

As has been mentioned in connection with the semiconductor device shown in FIG. 11, a step of forming an opening in the conducive plug 6C on the gate electrode 5 may be added to the above processing steps. Further, the gate electrodes may be formed so as to assume a multilayer structure of more than two layers, and a top layer is removed from the gate electrode 5.

The present invention is not limited to the previous embodiments, and it is evident that the present invention is susceptible to various modifications within the technical scope of the present invention. The numbers, locations, and shapes of constituent elements are not limited to those described in the embodiments; the constituent elements may be embodied in arbitrary numbers, locations, and shapes suitable for carrying out the present invention.

The present invention, which has been embodied as described above, enables facilitated formation of a plug and an interconnection in a minute pattern at the time of simultaneous formation of a conductive plug embedded in a contact hole and interconnection embedded in a trench or linear opening. Consequently, the present invention yields an advantage of enabling manufacture of a high-density semiconductor device.

Obviously many modifications and variations of the present invention are possible in the light of the above teachings. It is therefore to be understood that within the scope of the appended claims the invention may by practiced otherwise than as specifically described.

The entire disclosure of a Japanese patent application no. 11-357876, filed on Dec. 16, 1999 including specification, claims, drawings and summary, on which the convention priority of the present application is based, are incorporated herein by reference in its entirety.

What is claimed is:

1. A semiconductor device comprising:
   a semiconductor substrate;
   a first semiconductor element having a first gate electrode and a pair of active regions by the gate electrode;
   a second semiconductor element having a second gate electrode and a pair of active regions by the gate electrode;
   an isolating layer formed on the semiconductor substrate to isolate the first and second semiconductor elements;
   an interlayer insulating film formed on the semiconductor substrate;
   a first conductive plug formed in the interlayer insulation film and on the isolating layer, the first conductive plug electrically connecting one of the active regions, which is adjacent to said isolating layer, and is of the first semiconductor element and one of the active regions, which is adjacent to said isolating layer, and is of the second semiconductor element;
   wherein:
      said first conductive plug is formed to fill the area between said first gate electrode and said second gate electrode; and
      said first conductive plug is terminated before reaching said first gate and second gate electrodes.

2. The semiconductor device according to claim 1, wherein
   said first conductive plug is formed continuously extending on said isolating layer, on said one of the active region of the first semiconductor element and on said one of the active region of the second semiconductor element.

3. The semiconductor device according to claim 1, further comprising;
   second conductive plugs formed on the other active regions of said first and second semiconductor elements.

4. The semiconductor device according to claim 3, wherein a shorter side of said first conductive plug and a side of the second conductive plugs have substantially the same length.

5. The semiconductor device according to claim 3, further comprising an insulation film for covering each of said gate electrodes, wherein the height of the upper surface of said second conductive plug is substantially the same height of the upper surface of said insulation film.

6. The semiconductor device according to claim 1, wherein
   said first conductive plug is formed of a lower conductive layer and an upper low resistance conductive layer.

7. The semiconductor device according to claim 1, further comprising an insulation film for covering each of said gate electrodes, wherein the height of the upper surface of said first conductive plug is substantially the same height of the upper surface of said insulation film.

8. A semiconductor device comprising:
   a semiconductor substrate;
   a first semiconductor element having a first gate electrode and a pair of active regions by the gate electrode;
   a second semiconductor element having a second gate electrode and a pair of active regions by the gate electrode;
   an isolating layer formed on the semiconductor substrate to isolate the first and second semiconductor elements;
   an interlayer insulating film formed on the semiconductor substrate;
   a first conductive plug formed in the interlayer insulation film and on the isolating layer, the first conductive plug electrically connecting one of the active regions of the first semiconductor element and one of the active regions of the second semiconductor element; and
   an insulation film for covering each of said gate electrodes, wherein:
      said first conductive plug is formed to fill the area between said first gate electrode and said second gate electrode; and
      the upper surface of said first conductive plug is depressed from the upper surface of said insulation film.

9. A semiconductor device comprising:
   a semiconductor substrate;
   a first semiconductor element having a first gate electrode and a pair of active regions by the gate electrode;
   a second semiconductor element having a second gate electrode and a pair of active regions by the gate electrode;
   an isolating layer formed on the semiconductor substrate to isolate the first and second semiconductor elements;
   a conductive line formed on said isolating layer;
   an interlayer insulating film formed on the semiconductor substrate;
   a first conductive plug formed in the interlayer insulating film and on the isolating layer, the first conductive plug electrically connecting said conductive line and at least one of the active regions, which is adjacent to said isolating layer, and is of the first semiconductor element or the second semiconductor element;
   wherein:
      said first conductive plug is formed to fill the area between said first gate electrode and said second gate electrode; and
      said first conductive plug is terminated before reaching said first and second gate electrodes.

10. The semiconductor device according to claim 9, wherein
   said conducive line is formed of a lower conductive layer and an upper low resistance conductive layer.

11. The semiconductor device according to claim 7, wherein
   said first conductive plug is formed continuously extending on said isolating layer, on said conductive line and at least one of the active regions of the first semiconductor element or the second semiconductor element.

12. The semiconductor device according to claim 9, further comprising;
   second conductive plugs formed on the other active regions of said first and second semiconductor elements.

13. The semiconductor device according to claim 12 wherein
a shorter side of said first conductive plug and a side of the second conductive plugs have substantially the same length.

14. The semiconductor device according to claim 9, wherein
said first conductive plug is formed of a lower conductive layer and an upper low resistance conductive layer.

15. A semiconductor device comprising:
a semiconductor substrate;
a first semiconductor element having a first gate electrode and a pair of active regions by the gate electrode;
a second semiconductor element having a second gate electrode and a pair of active regions by the gate electrode;
an isolating layer formed on the semiconductor substrate to isolate the first and second semiconductor elements;
a conductive line formed on said isolating layer;
an interlayer insulating film formed on the semiconductor substrate;
a first conductive plug formed in the interlayer insulating film and on the isolating layer, the first conductive plug electrically connecting said conductive line and at least one of the active regions of the first semiconductor element or the second semiconductor element; and
an insulation film for covering said gate electrodes, wherein:
said first conductive plug is formed to fill the area between said first gate electrode and said second gate electrode; and
the upper surface of said first conductive plug is depressed from the upper surface of said insulation film.

16. The semiconductor device according to claim 15, wherein
said insulation film is formed of a material different from the material of said isolation layer and said interlayer insulation film.

17. The semiconductor device according to claim 15, further comprising:
a surface insulation film formed between said insulation film and said semiconductor substrate, said surface insulation film being formed of a material different from the material of said insulation film.

* * * * *